(12) United States Patent
Philips et al.

(10) Patent No.: US 9,488,678 B2
(45) Date of Patent: Nov. 8, 2016

(54) APPARATUS AND METHOD FOR MEASURING GEOMAGNETICALLY INDUCED CURRENTS (GIC) IN HIGH VOLTAGE TRANSMISSION CONDUCTORS

(71) Applicant: Electric Power Research Institute, Inc., Charlotte, NC (US)

(72) Inventors: Andrew John Philips, Harrisburg, NC (US); Richard Lordan, Palo Alto, CA (US); J. Mark Major, San Antonio, TX (US)

(73) Assignee: Electric Power Research Institute, Inc., Charlotte, NC (US)

( * ) Notice: Subject to any disclaimer, the term of this patent is extended or adjusted under 35 U.S.C. 154(b) by 137 days.

(21) Appl. No.: 14/325,663

(22) Filed: Jul. 8, 2014

(65) Prior Publication Data
US 2016/0011241 A1 Jan. 14, 2016

Related U.S. Application Data

(63) Continuation-in-part of application No. 13/551,085, filed on Jul. 17, 2012, now Pat. No. 9,261,414, and a continuation-in-part of application No. 13/728,462, filed on Dec. 27, 2012, now Pat. No. 9,261,549.

(51) Int. Cl.
*G01R 15/20* (2006.01)
*G01R 33/07* (2006.01)
*G01R 15/14* (2006.01)

(52) U.S. Cl.
CPC ........... *G01R 15/202* (2013.01); *G01R 15/144* (2013.01); *G01R 33/07* (2013.01)

(58) Field of Classification Search
CPC .............. G01R 15/202; G01R 15/205; G01R 19/0092; G01R 1/06788; G01R 15/14; G01R 15/18; G01R 15/181; G01R 31/3606; G01R 19/165; G01R 19/16547; G01R 19/2513; G01R 21/00; G01R 21/06; G01R 33/07; G01R 33/18; H01F 2027/328; H01F 27/327; H01F 29/06; H01F 29/12; H01F 41/08; G05F 1/325
See application file for complete search history.

(56) References Cited

U.S. PATENT DOCUMENTS

| | | | | |
|---|---|---|---|---|
| 3,512,045 A | * | 5/1970 | Sanger | H01F 38/38 336/175 |
| 4,728,887 A | * | 3/1988 | Davis | G01R 15/14 324/127 |
| 6,750,644 B1 | * | 6/2004 | Berkcan | G01R 33/02 324/117 H |
| 8,330,449 B2 | * | 12/2012 | Greenberg | G01R 15/12 324/115 |
| 2011/0221432 A1 | * | 9/2011 | Oota | G01L 3/104 324/251 |

\* cited by examiner

Primary Examiner — Vinh Nguyen
(74) Attorney, Agent, or Firm — Trego, Hines & Ladenheim, PLLC; Brandon Trego; Jonathan Hines

(57) ABSTRACT

An apparatus and method for measuring geomagnetically induced currents (GIC) is disclosed. The apparatus is configured to measure GICs temporarily flowing in high-voltage, 60 Hz power transmission conductors, and includes a securing means for securing the apparatus to the power transmission conductor. The apparatus further includes a flux concentrator having a toroidal ferrite core and winding wound around the core configured to capture a magnetic field from the power transmission conductor; a hall-effect sensor assembly configured to receive the magnetic field from the flux concentrator and produce a voltage signal corresponding to the magnetic field; and an electronics module configured to receive the voltage signal from the hall-effect sensor assembly, conduct measurements, and transmit the measurements to a local access point.

16 Claims, 9 Drawing Sheets

APPARATUS AND METHOD FOR MEASURING GEOMAGNETICALLY INDUCED CURRENTS (GIC) IN HIGH VOLTAGE TRANSMISSION CONDUCTORS

BACKGROUND OF THE INVENTION

This application relates to an apparatus and method for measuring geomagnetically induced currents (GIC), and more particularly, to an apparatus and method for measuring DC currents that flow through high voltage transmission conductors when solar storms are active.

Solar Flares on the run result in an ejection of charge which, when it travels past the earth, results in a disruption of the earth's magnetic field. This disruption results in potential differences along the length of transmission lines, which, in turn, results in current flow. These currents vary slowly with time and, once they are induced into the transmission system, for all intents and purposes can be considered to be DC currents.

These DC currents often flow to earth through transmission transformer windings, resulting in saturation of the transformer cores which results in heating, harmonics, vibration, and Volt Ampere Reactive (VAR) consumption. This saturation can lead to system degradation and voltage collapse and/or transformer heating which can lead to premature aging or failure. As a result, a considerable effort is underway to fully understand the phenomena, its impact, and what mitigation procedures or technologies can be applied.

An important part of understanding the phenomena as well as implementing mitigation procedures is measuring the magnitudes of these DC currents. To date all measurements have been performed by measuring the DC currents in the neutral of transformers because (a) access is possible, (b) it is at low voltage, and (c) the data is easy to integrate into a measurement system. The challenge of this measurement approach is that no knowledge is obtained as to what the level of DC currents are in the individual phases.

Accordingly, there is a need for an apparatus and method that measures the DC current on a high voltage conductor for transformer configurations in which the induced DC current does not flow to earth ground.

BRIEF SUMMARY OF THE INVENTION

These and other shortcomings of the prior art are addressed by the present invention, which provides an apparatus and method for measuring DC currents flowing through each of the phases.

According to one aspect of the invention, an apparatus configured to measure ground induced currents (GIC) temporarily flowing in high-voltage, 50 Hz/60 Hz power transmission conductors includes a securing means for securing the apparatus to the power transmission conductor without disconnecting or cutting the conductor. The apparatus further includes a flux concentrator having a split core toroidal ferrite core and winding wound around the core configured to capture a magnetic field from the power transmission conductor; a hall-effect sensor assembly configured to receive the magnetic field from the flux concentrator and produce a voltage signal corresponding to the magnetic field; and an electronics module configured to receive the voltage signal from the hall-effect sensor assembly, conduct measurements, and transmit the measurements wirelessly to a local access point.

According to another aspect of the invention, an apparatus configured to measure ground induced currents (GIC) temporarily flowing in high-voltage, 50 Hz/60 Hz power transmission conductors includes a flux concentrator having a split core toroidal ferrite core and winding wound around the core configured to capture a magnetic field from the power transmission conductor, the flux concentrator being formed of first and second halves; a hall-effect sensor assembly configured to receive the magnetic field from the flux concentrator and produce a voltage signal corresponding to the magnetic field; and an electronics module configured to receive the voltage signal from the hall-effect sensor assembly, conduct measurements, and transmit the measurements wirelessly to a local access point.

According to another aspect of the invention, a method for measuring ground induced currents (GIC) flowing in high-voltage, 60 Hz power transmission conductors, includes the steps of securing an apparatus configured to measure GIC to a high-voltage conductor supplying a transformer. The apparatus includes a flux concentrator, a hall-effect sensor assembly, and an electronics module. The method further including the steps of using the flux concentrator to capture a magnetic field from the power transmission conductor; using the hall-effect sensor assembly to receive the magnetic field from the flux concentrator and provide the electronics module with a voltage signal corresponding to the magnetic field; and using the electronics module to process the voltage signal from the hall-effect sensor and transmit data wirelessly to a local access point.

BRIEF DESCRIPTION OF THE INVENTION

The subject matter that is regarded as the invention may be best understood by reference to the following description taken in conjunction with the accompanying drawing figures in which.

DETAILED DESCRIPTION OF THE INVENTION

Figure 1:
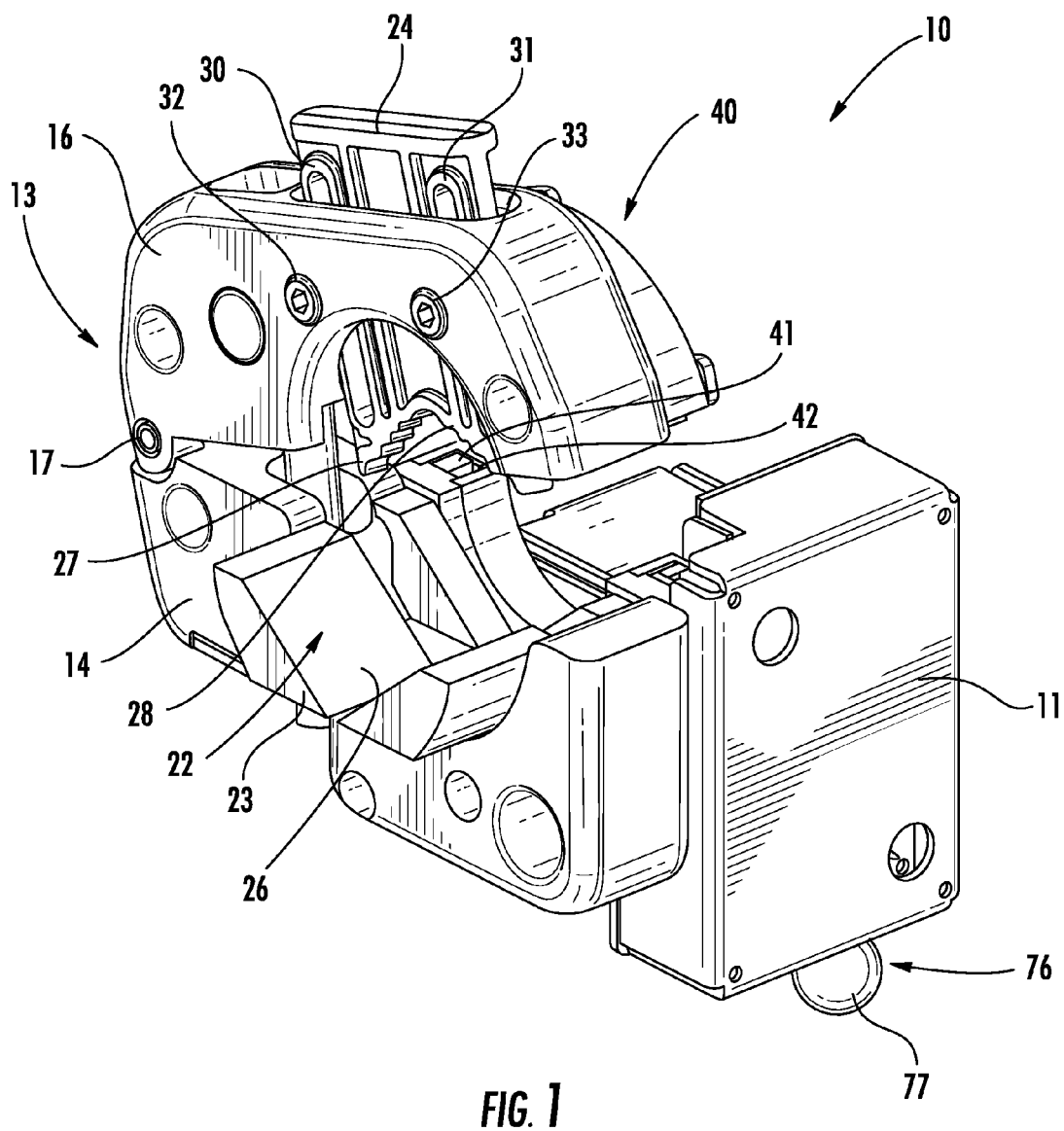
FIGS. 1-4 show an apparatus according to an embodiment of the invention.
Figure 2:
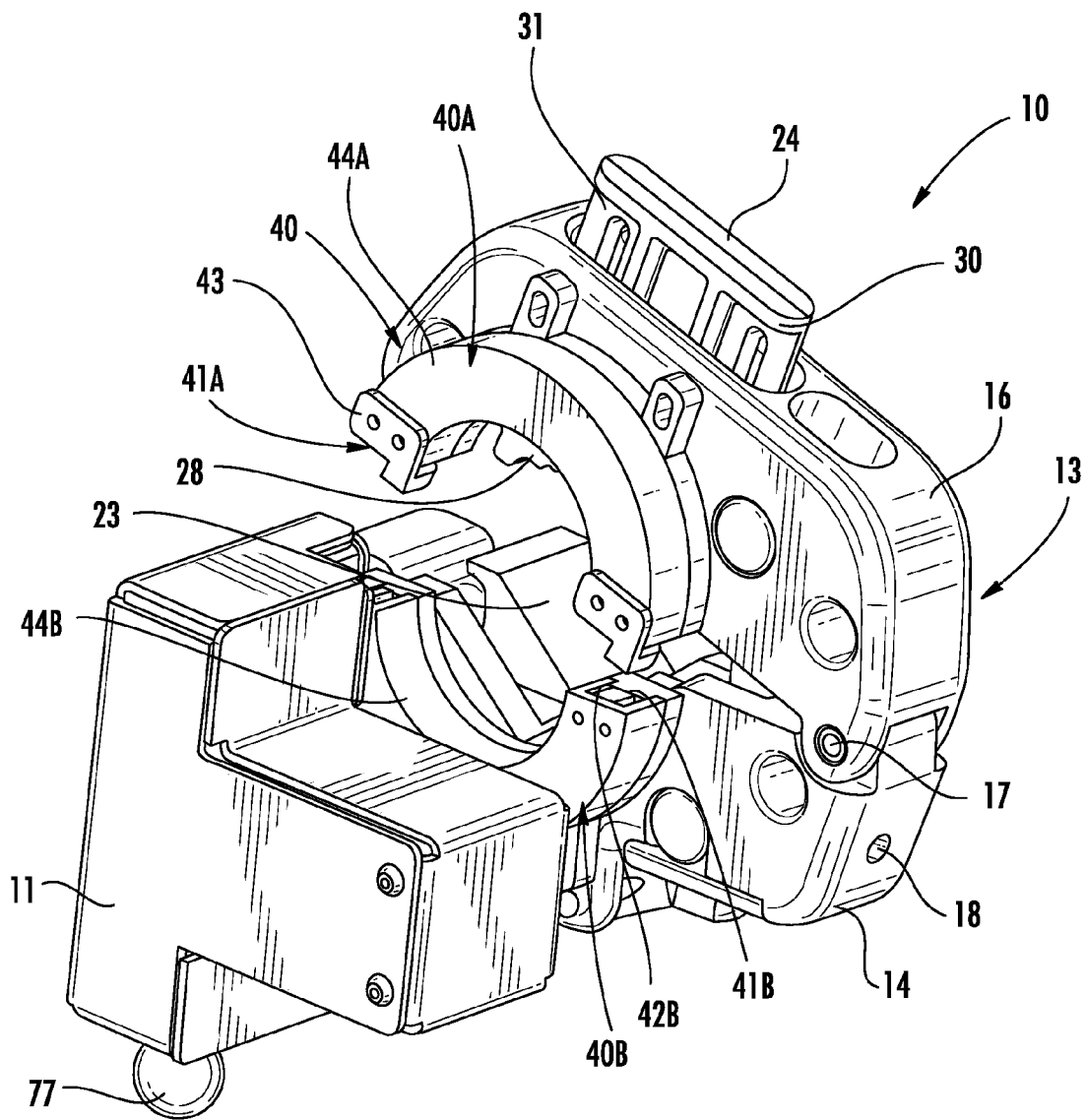
Figure 3:
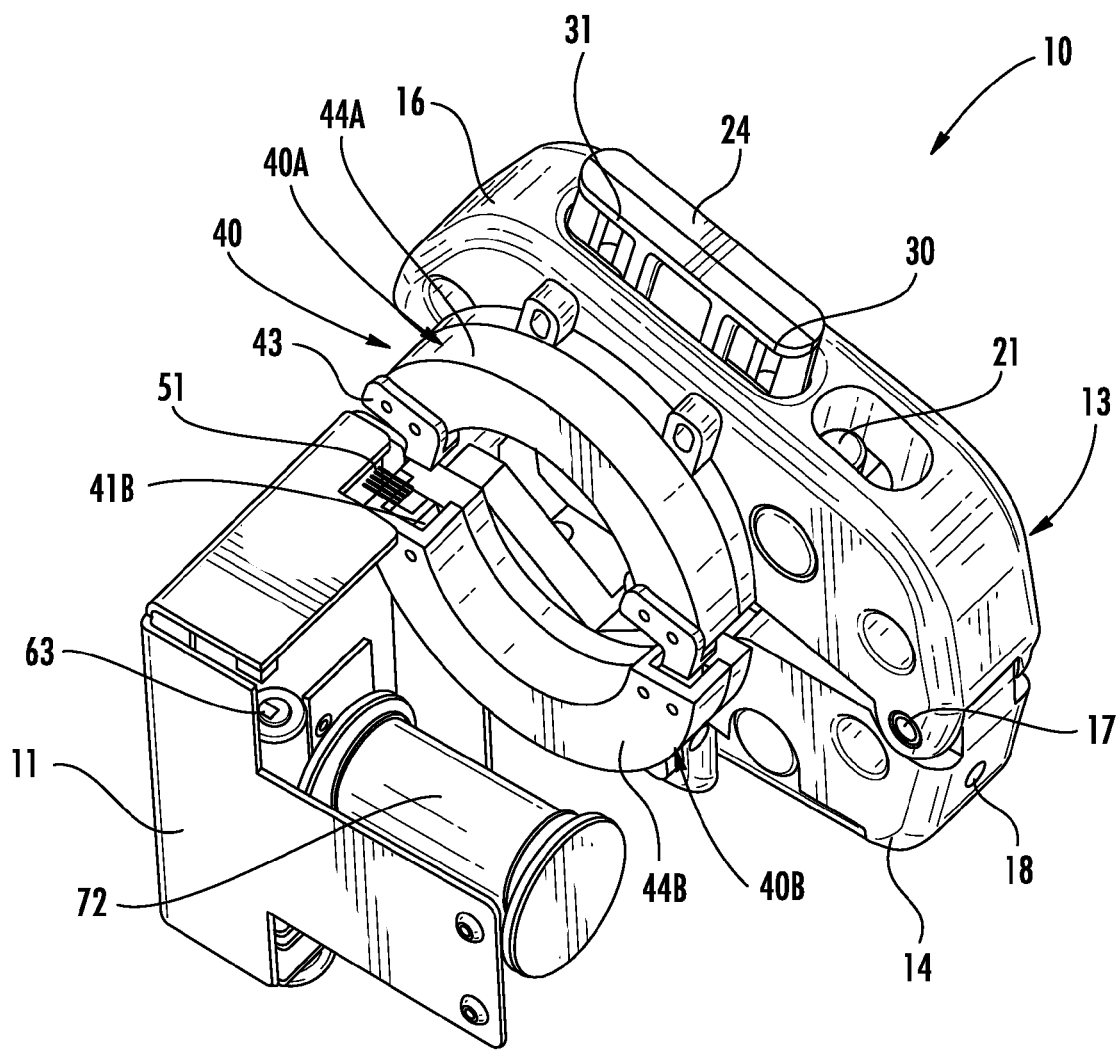

Referring to the drawings, an exemplary apparatus for measuring DC currents according to the present invention is illustrated in FIGS. 1-4 and shown generally at reference numeral 10. The apparatus 10 is used to measure DC currents that temporarily flow through high-voltage (greater than 33kV) 60 Hz electric power transmission lines when solar storms are active. These DC currents may saturate power transformers which can lead to system damage and/or degradation.

The apparatus 10 clips on or around high voltage leads supplying a transformer (which could be at a voltage as high as 1000kV) without cutting or disconnecting the leads, and includes an electronics housing 11 connected to a jaw assembly 13. All edges of conductive components are rounded to ensure that the electrical field magnitudes are low, thereby preventing corona activity. Further, the sensor is filled with an epoxy compound to provide environmental protection. U.S. patent application Ser. No. 13/551,085 is hereby incorporated herein.

The jaw assembly 13 includes a socket 18 for allowing a hot stick (not shown) to be attached to the apparatus 10 by a mating fastener; thereby allowing the sensor 10 to be placed onto an energized conductor. The hotstick is removed after installation.

Figure 4:
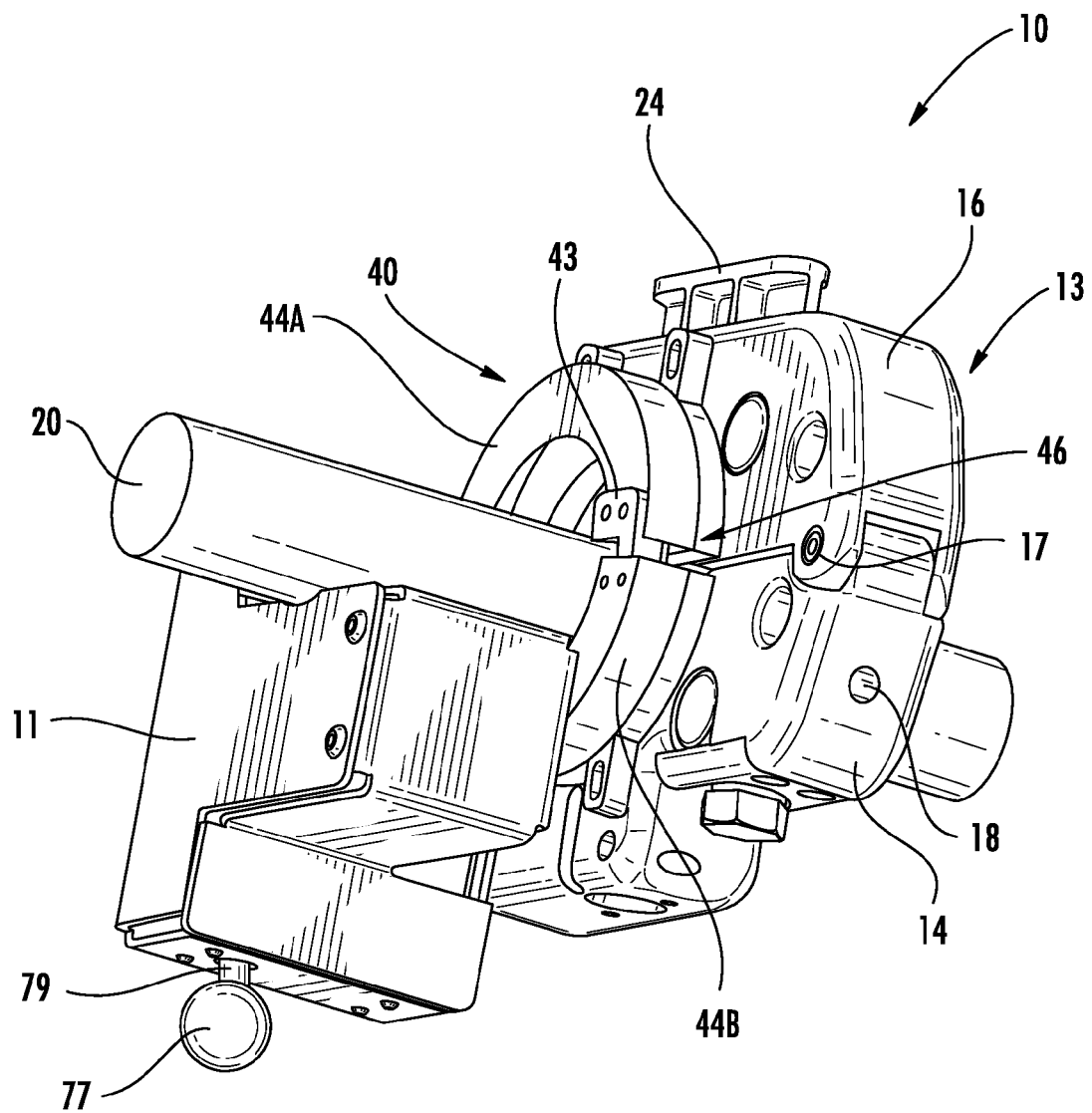

The jaw assembly 13 includes a first jaw 14 pivotally attached to a second jaw 16 via pivot joint 17 to allow the jaw assembly 13 to move between an open position, to receive a conductor therein, and closed position, to secure the apparatus 10 to a high voltage lead or conductor 20, FIG. 4. The jaw assembly 13 is secured in the closed position by a fastener 21 which extends through the first and second jaws 14, 16. The fastener 21 may be tightened by a standard wrench or socket type tool.

The jaw assembly 13 further includes an adjustable clamping assembly 22 having first and second clamping mechanisms 23, 24. Both clamping mechanisms 23 and 24 include a concave inner surface 26 and 27 to complement the rounded outside surface of the conductor 20. The inner surface 26 is sloped or V-shaped while the inner surface 27 includes a plurality of steps 28 that act like teeth to secure the apparatus 10 to the conductor 20. Together, the concave inner surfaces 26, 27 and steps 28 of the clamping mechanisms 23, 24 allow the clamping assembly 22 to mate with and secure the apparatus 10 to various sized conductors, i.e., conductors of different diameters. As shown, the clamping assembly 22 is made of a thermoplastic; however, other suitable materials may be used.

The clamping mechanism 24 includes elongated slots 30 and 31 adapted to receive fasteners 32 and 33 therethrough. The slots 30, 31 allow the clamping mechanism 24 to be slidably mounted to jaw 16 to allow the clamping assembly 22 to be moved from a non-clamping position, to receive conductors of varying diameters, to a clamping position to secure the apparatus 10 to the conductor 20, FIG. 4.

A flux concentrator 40 is attached to the jaw assembly 13. The flux concentrator 40 is a ferromagnetic split core flux concentrator. The flux concentrator 40 includes a toroidal ferrite core 41 and winding 42 wound around the core 41 with multiple turns. The flux concentrator 40 is formed of two halves 40A and 40B with cores 41A and 41B and windings 42A and 42B to allow the flux concentrator 40 to move with the jaws 13 between closed and opened positions. The winding 42 reduces AC flux while leaving DC flux unaffected. The winding 42 may be, for example, formed of 240 turns of No. 18 magnet wire. A sheet metal housing 44 (steel which is ferromagnetic for magnetic field shielding) surrounds the core 41. As shown, the housing 44 is also formed by two halves 44A and 44B to surround respective flux concentrator halves 40A and 40B. Shims 43 are used to create a gap 46 of approximately 0.16 inches at an interface between the two halves 40A and 40B to allow the insertion of a hall-effect sensor assembly 50.

Figure 5:
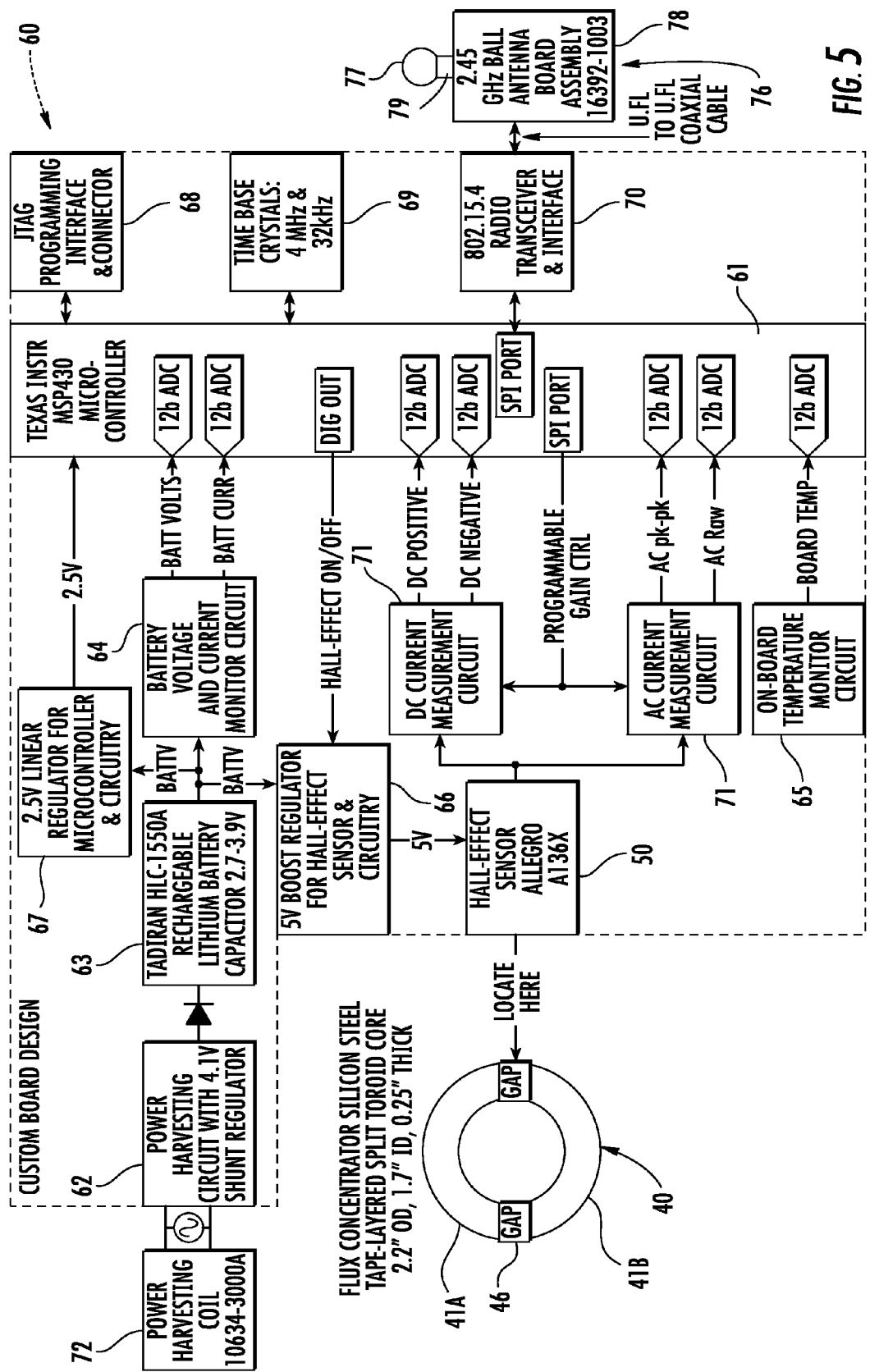
FIG. 5 is an electronics architecture diagram for the apparatus of FIG. 1.
Figure 6:
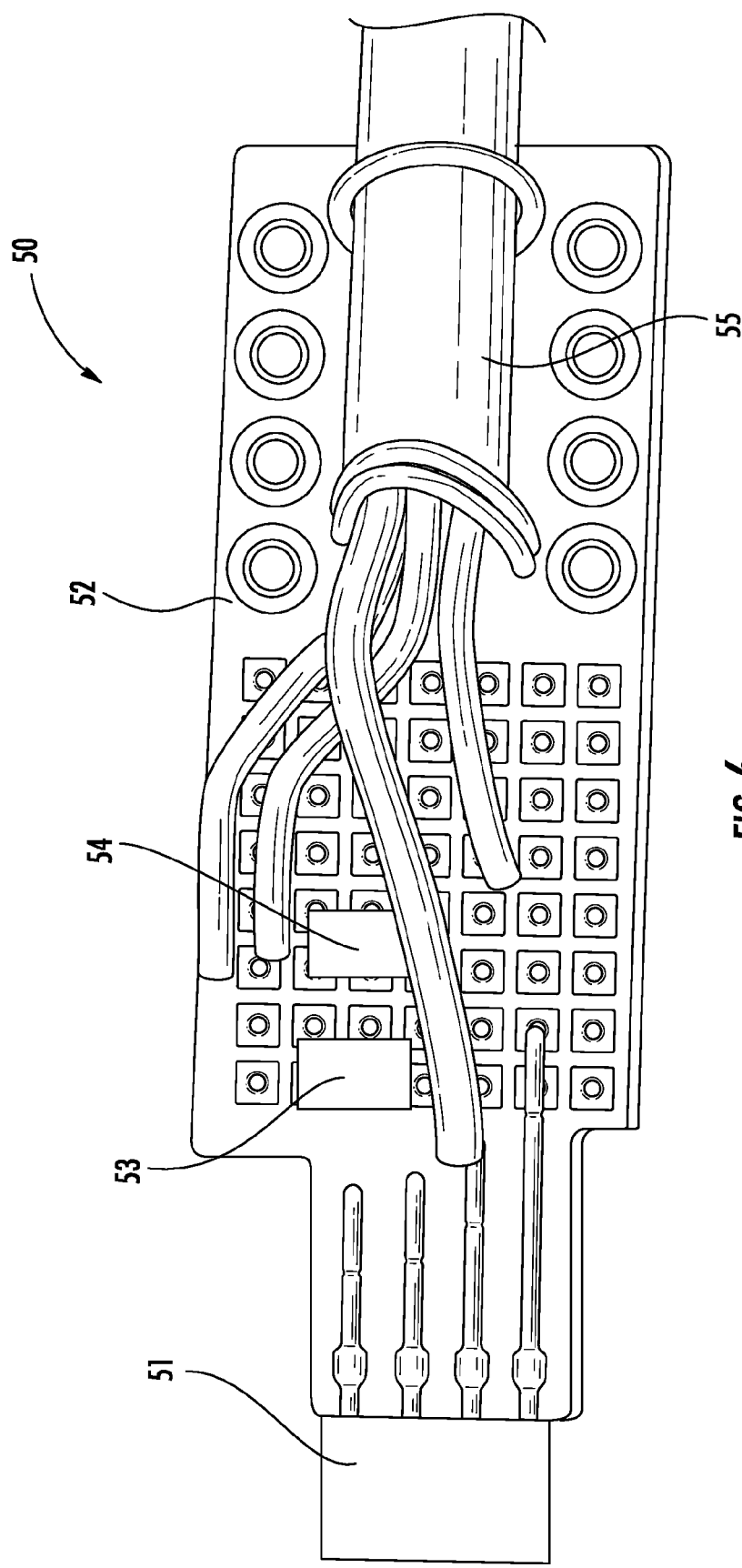
FIG. 6 shows a hall-effect sensor assembly of the apparatus of FIG. 1.

The hall-effect sensor assembly 50 is electrically connected to a main electronics module 60, FIG. 5, and includes a chip 51, such as an Allegro A136x, mounted to a small circuit board 52 having a pair of filtering capacitors 53 and 54 soldered across appropriate pins, see FIG. 6. A four-wire shielded cable is used to make the pin connections (+5V supply, output, and two circuit grounds). The chip 51 and circuit board 52 are wrapped with insulating KAPTON tape and then over-wrapped with copper tape to shield it. The hall-effect sensor assembly 50 produces a voltage signal that corresponds to the magnetic field that is produced from an electrical current. It responds to both AC currents as well as positive or negative DC currents. The chip 51 is available in a range of sensitivities from 0.7 to 16 mV/Gauss with a bandwidth of up to 50 kHz.

The hall-effect sensor assembly 50 uses the flux concentrator 40 to capture the magnetic field from the power line conductor 20 and provide enough Gauss to the sensor assembly 50 for a reliable measurement. The hall-effect sensor assembly 50 is placed in the gap 46 between the two flux concentrator halves 40A and 40B. The gap spacing and positioning of the sensor assembly 50 within the gap 46 must be mechanically controlled in order to obtain consistent current readings.

As shown in FIG. 5, the electronics module 60 includes a microcontroller 61, a power harvesting circuit 62, a rechargeable battery 63, a battery monitor 64, an on-board temperature monitor circuit 65, a 5V regulator 66, a 2.5V regulator 67, a JTAG programming interface 68, time base crystals 69, and a radio transceiver 70. A vibration sensor such as an accelerometer (not shown) may also be installed in or on electronics module 60 to measure harmonics or vibrations resulting from geomagnetically induced DC currents flowing in a transmission conductor. These harmonics or vibrations help understand the impact that GICs have on the life expectancy of transmformers. Capacitive probes (not shown) are also used to measure voltage.

The microcontroller 61 is the digital control processor that dictates the apparatus's 10 sequence of operations based on custom application firmware that is loaded into the microcontroller 61 during final stages of assembly.

A power harvesting coil 72 produces a voltage that can be rectified and regulated in order to power the apparatus 10 and also to charge the rechargeable lithium battery 63 which allows operation when the apparatus 10 is off line or the line is down. The power harvesting circuit 62 uses a capacitor-diode ladder to quadruple the rectified DC voltage in order to enable operation at lower current levels than would otherwise be possible. The circuit 62 uses a shunt regulator at 4.1V to take full advantage of the battery's 63 capacity.

As illustrated, the lithium battery 63 is a Tadiran PulsesPlus® HLC-1550A hybrid layer capacitor lithium battery. It should be appreciated that other equivalent rechargeable batteries may be used. It provides approximately 250 mA-hrs of backup energy to power the apparatus 10 when it is off line or the line is down. This rechargeable battery technology is ideal for low power application because it provides a power reservoir to meet the short term pulse burst demands of the radio transceiver 70 over the wide range of operating temperatures that the apparatus 10 is likely to experience. When fully charged to approximately 3.9V, which is the normal state when line harvesting, the 250 mA-hrs of energy can provide many weeks of backup power. The actual amount of backup time depends on the apparatus's 10 configuration (i.e., how often it takes new measurement readings and how often it wirelessly transmits those readings).

The battery voltage and current are monitored as an indication of the apparatus's 10 health. Operational amplifier circuits are used to scale these signals for the microcontroller's 61 analog-to-digital converter. The microcontroller 61 averages samples taken over multiple 60-Hz cycles in order to obtain a stable reading.

On-board temperature is also monitored as an indication of the apparatus's 10 health. The on-board temperature is monitored using an integrated circuit temperature sensor chip 65 such as National Semiconductor's LM20. The temperature sensor chip 65 produces a voltage that is proportional to temperature. This signal is provided to the microcontroller's 61 analog-to-digital converter and is read similar to the battery monitor signals.

The hall-effect sensor assembly 50 and AC/DC current measurement circuitry 71 requires a single 5V supply rail at approximately 12 mA. This is a relatively large current draw, therefore the 5V regulator 68 is only enabled for short periods to take measurements and is otherwise disabled to keep the average apparatus 10 current on the order of 100 microamps to optimize power harvesting and battery backup time.

The remainder of the apparatus's 10 circuitry operates from a single 2.5V supply rail that is continuously enabled. The radio transceiver 70 presents a significant load on the order of 100 mA, but only pulls that load for milliseconds when periodically transmitting and receiving.

Figure 7:
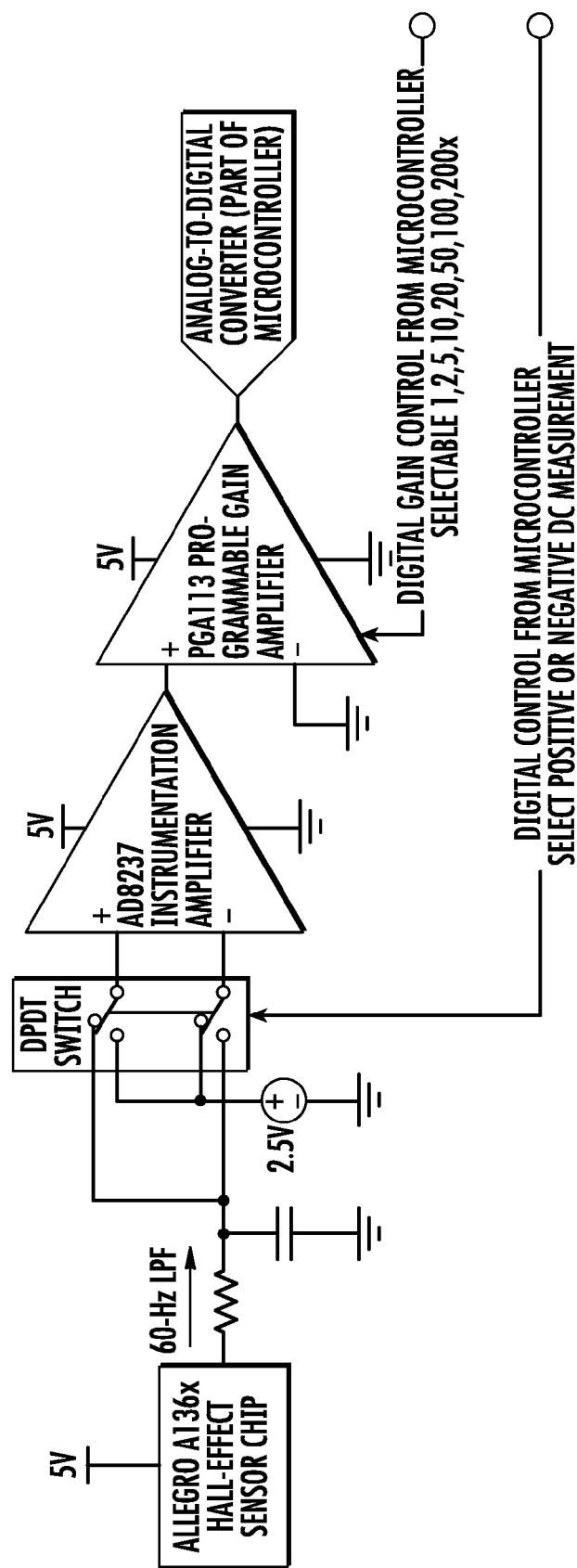
FIG. 7 illustrates a DC measurement circuit of the apparatus of FIG. 1.
Figure 8:
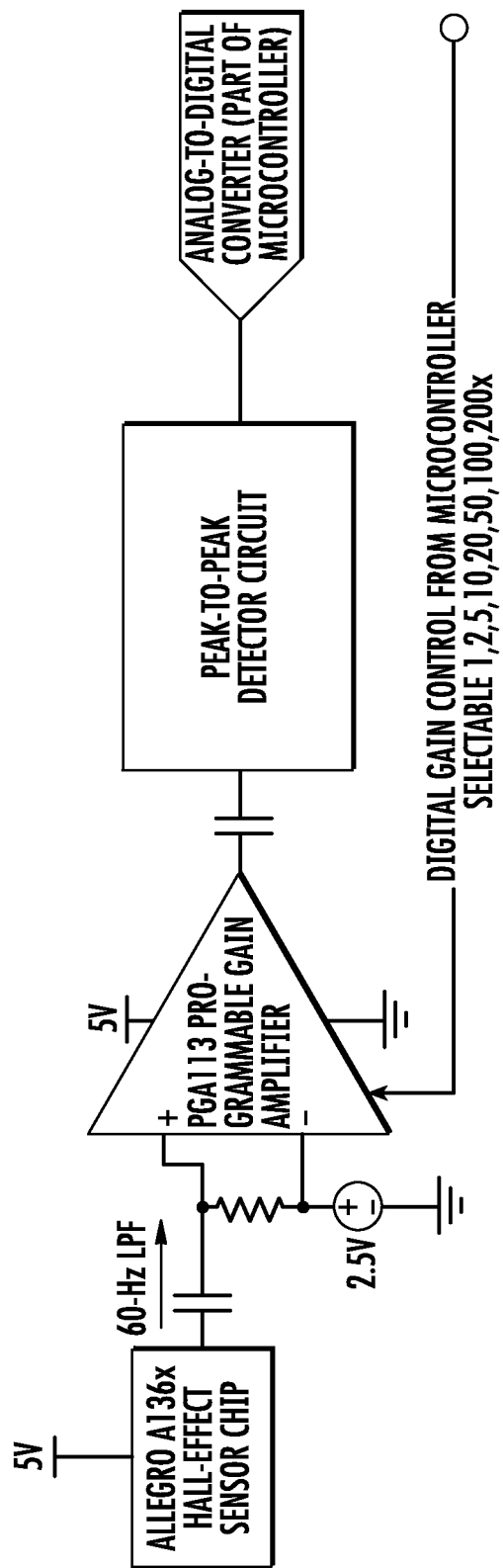
FIG. 8 illustrates an AC measurement circuit of the apparatus of FIGS. 1.

Referring to FIGS. 7 and 8, AC and DC current measurement is performed as follows:

(a) For DC Current Measurement: The output from the hall-effect sensor assembly 50 is fed to separate measurement circuits for AC and DC readings. The AC reading indicates the 60-Hz line current while the DC reading indicates the GIC level. The hall-effect sensor output is nominally 2.5V when the sensed current is zero; it goes higher, approaching 5V, for positive currents, and lower, approaching 0V, for negative currents. The hall-effect sensor assembly 50 output is fed to an instrumentation amplifier along with a 2.5Vreference voltage through an electronic DPDT switch to allow polarity reversal. The instrumentation amplifier output is fed through a programmable gain amplifier and is then digitized using the sensor microcontroller. The sensor averages samples taken over multiple 60-Hz cycles in order to obtain the DC reading. Polarity and gain are controlled in order to maximize signal level and thereby optimize reading accuracy.

(b) For AC Current Measurement: The AC circuit uses an RC high pass filter to remove the DC component. The hall-effect sensor assembly 50 output is fed to a programmable gain amplifier, then to a peak-to-peak detector, and is then digitized using the microcontroller 61. Gain is controlled in order to maximize the signal level and thereby optimizes reading accuracy/resolution.

Microcontroller firmware is used to program the apparatus 10 via a Joint Test Action Group (JTAG) programming interface connector. The microcontroller 61 produces accurate clock and timing signals from on-board crystals 69. Two separate crystals are used in the apparatus 10. A 4-MHz crystal is used for the main time base when the microcontroller 61 is actively running. The 4-MHz clock circuit is only enabled when needed in order to conserve power. A lower-power 32-kHz crystal clock circuit is used to count time when the microcontroller 61 is sleeping which is the majority of time.

The apparatus 10 uses an IEEE 802.15.4 standard 2.45 GHz radio transceiver 70 to wirelessly communicate with a local Zigbee Access Point (ZAP). Information is passed in both directions. The apparatus 10 periodically transmit readings to the ZAP in accordance with a defined message protocol based on sensor type. The ZAP responds to sensor readings with configuration changes when needed.

The apparatus 10 uses the power harvesting coil 72 to harvest power from the AC line current in order to operate continuously without battery life concerns. Power is harvested inductively from the 60-Hz magnetic field using a custom coil on a ferrite core.

Antenna assembly 76 is electrically connected to the radio transceiver 70 in order to achieve the fullest wireless range that is possible. This is normally on the order of 1,000 feet when there is a clear line-of sight between the apparatus 10 and ZAP (reader). The antenna assembly 76 is designed to minimize corona and includes a 0.75" diameter metal ball 77 that is tapped and mounted onto a printed circuit board 78 with a screw and 0.25" long standoff 79. The circuit board 78 transforms the impedance of the ball 77 and standoff to match the standard 50-Ohm output of the radio transceiver 70. Although the metal ball 77 protrudes from the metal housing 11, it is DC-grounded to the metal housing 11. This protects the apparatus 10 from potentially damaging ESD (electrostatic discharge) events that could otherwise occur due to handling.

Figure 9:
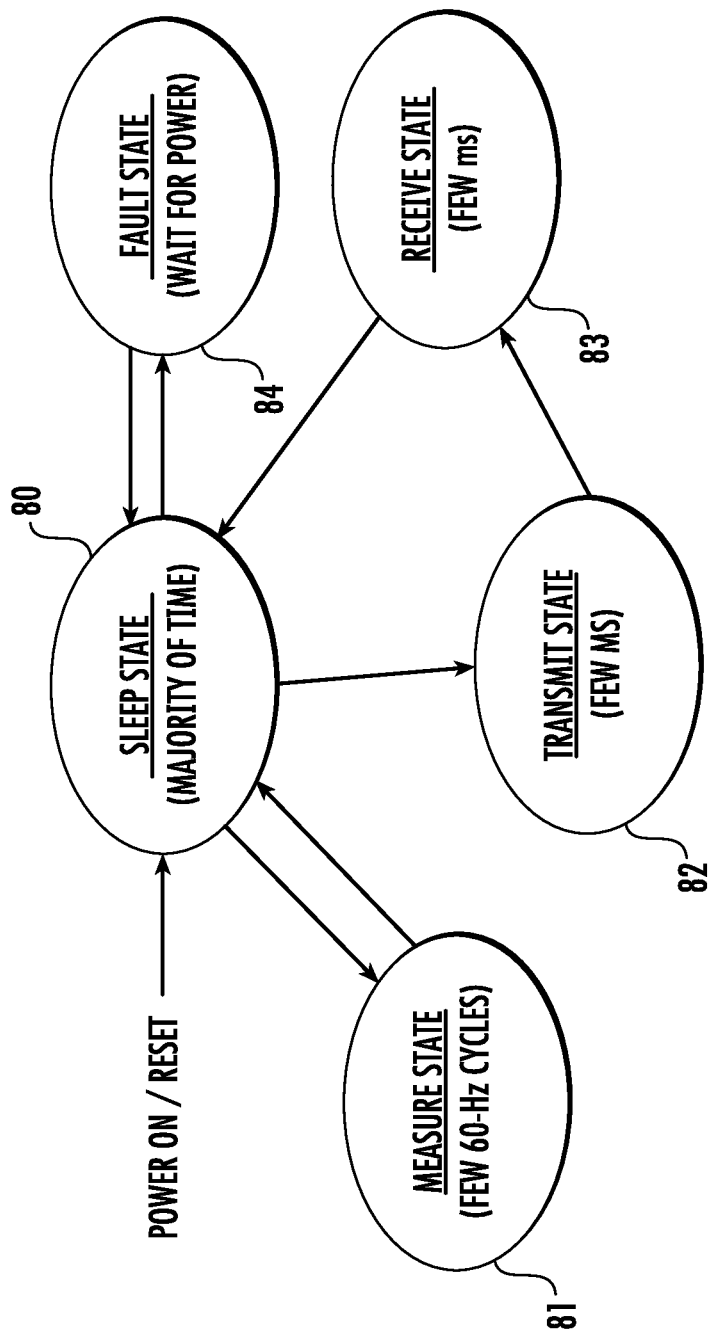
FIG. 9 shows an operating state diagram for the apparatus of FIG. 1.

As described above, the microcontroller 61 is a digital control processor that operates the apparatus 10 according to firmware that is custom developed and specific to the application of the apparatus 10. The apparatus's 10 operating state is illustrated in FIG. 9.

The apparatus 10 spends the majority of its time in the sleep state 80 conserving power. The microcontroller 61 is designed with flexible features to minimize power consumption. The 32 kHz crystal provides an accurate low-power clock for counting time while waiting to enter active states (measure state 81, transmit state 82, receive state 83, and fault state 84). Current draw during the sleep state is typically on the order of 25 micro-amps. The apparatus 10 uses configuration variables to tell it how often to wake up for measurements 81 and radio transmissions 82. The time interval between measurements 81 and radio transmissions 82 are separately configured, but often set the same. These time intervals can be as short as 1 second, but significant power reduction can be achieved with intervals on the order of 30 seconds.

At the configured measurement state 81, the apparatus 10 acquires a new set of readings for the following measurements that it makes:

(a) DC Line Current (GIC)
(b) AC Line Current (60-Hz)
(c) Battery Voltage (health information)
(d) Battery Current (health information)
(e) Board Temperature (health and environmental information)

Each of these measurements are averaged from samples taken over multiple 60-Hz cycles in order to minimize induced 60-Hz noise from the high voltage and high currents of the power line 20. To accomplish this, the microcontroller 61 needs to stay on for at least 33.3 milliseconds, i.e., two 60-Hz cycles.

At a configured radio transmission interval, the apparatus 10 enters the transmit state 82 and communicates its data message with the latest readings via the radio transceiver 70. The radio transmission takes place in a short burst of just a few milliseconds duration. After the radio transmission is complete, the apparatus enters the receive state 83 to wait a few more milliseconds for a possible reply from the ZAP (reader). A ZAP reply is not required, but is a mechanism within the system to reconfigure the apparatus 10. The apparatus 10 has a number of reconfigurable parameters that can be changed in the field via the radio transceiver 70. ZAP replies are also used for sensor clock adjustments (time of day) which are embedded in the radio communications for security purposes. Whether or not a reply is received, the apparatus 10 reverts back to the sleep state 80 within a few milliseconds to conserve power until it is time for the next set of measurements or radio transmission.

If the apparatus 10 does not have enough battery voltage to transmit, then it goes into a deep sleep fault state 84 and waits for power to be harvested, rather than needlessly attempting to acquire new measurements (aside from battery voltage) and transmitting. This is determined from the battery voltage measurement and configuration parameters that indicate the battery voltage thresholds at which to enter and recover from this state. The fault state 84 is a worst case scenario that is not expected to be encountered often.

In use, the apparatus 10 is secured to the high voltage lead 20 using the jaw assembly 13. The jaw assembly 13 is moved to the open position such that the first and second jaws 14, 16 pivot about joint 17 to provide a gap between the jaws 14 and 16 sufficient enough to receive the lead 20. Once the lead 20 is positioned between first and second clamping mechanisms 23, 24, the jaw assembly 13 is moved to the closed position such that the lead 20 is clamped between mechanisms 23 and 24. Clamping mechanism 24 may be adjusted to fit the size of the lead 20.

Once installed on the lead 20, the apparatus 10 operates as described above and is used to conduct measurements (DC and AC currents for each phase—10s of DC amps and 2000A of AC current; voltage; mechanical vibrations; harmonics in the voltage and AC current—algorithms such as Fast Fourier Transform are employed) that are transmitted to the ZAP. Measurement of the DC current informs operators that a GIC event is underway and provides them with its magnitude; thus, allowing operators to take mitigating measures such as reconfiguring the grid or reducing the impact and vulnerability of the grid. The DC current measurement also helps operators understand the impact of GICs on life expectancy. Measurement of the AC current at the time of the GIC event provides tells operators the loading of the transformer. Measurement of vibrations and/or harmonics at the time of a GIC event also helps operators understand the impact of GICs on life expectancy of transformers. It should be appreciated that data from multiple transformers may be collected in a single base station. Once the data is transmitted, the data is analyzed.

The foregoing has described an apparatus and method for measuring geomagnetically induced currents in high voltage transmission conductors. While specific embodiments of the present invention have been described, it will be apparent to those skilled in the art that various modifications thereto can be made without departing from the spirit and scope of the invention. Accordingly, the foregoing description of the preferred embodiment of the invention and the best mode for practicing the invention are provided for the purpose of illustration only and not for the purpose of limitation.

We Claim:

1. An apparatus configured to measure geomagnetically induced currents (GIC) temporarily flowing in high-voltage, 50 Hz or 60 Hz power transmission conductors, comprising:
   (a) a securing means for securing the apparatus to the power transmission conductor;
   (b) a flux concentrator configured to capture a magnetic field from the power transmission conductor, the flux concentrator having first and second halves, each half including a toroidal ferrite core and a winding wound around the core, wherein the winding is configured to reduce alternating current flux while leaving direct current flux unaffected;
   (c) a hall-effect sensor assembly positioned in a gap between the first and second halves of the flux concentrator and configured to receive the magnetic field from the flux concentrator and produce a voltage signal corresponding to the magnetic field; and
   (d) an electronics module configured to receive the voltage signal from the hall-effect sensor assembly, conduct measurements, and transmit the measurements to a local access point, wherein the electronics module includes a direct current measurement circuit and an alternating current measurement circuit, wherein both of the current measurement circuits are electrically connected to the hall effect sensor.

2. The apparatus according to claim 1, wherein the securing means comprises a jaw assembly having a first jaw pivotally connected to a second jaw to allow the jaw assembly to move between an open position for receiving the power transmission conductor therein and a closed position for securing the apparatus to the power transmission conductor.

3. The apparatus according to claim 2, wherein the jaw assembly further includes a clamping assembly operably connected to the first and second jaws, the clamping assembly being adapted to provide a clamping force around the power transmission conductor, thereby securing the apparatus to the power transmission conductor.

4. The apparatus according to claim 1, wherein the hall-effect sensor assembly includes:
   (a) circuit board having a pair of filtering capacitors; and
   (b) an integrated circuit hall-effect sensor chip mounted to the circuit board.

5. The apparatus according to claim 2, wherein the first and second halves permit the flux concentrator to move between the open and closed positions with the first and second jaws.

6. The apparatus according to claim 1, wherein the measurements are transmitted to the local access point by a radio transceiver of the electronics module.

7. The apparatus according to claim 6, further including an antenna assembly electrically connected to the radio transceiver to enable the radio transceiver to transmit and receive data to and from the local access point, the antenna assembly having an antenna ball to reduce corona.

8. The apparatus according to claim 1, further including a power harvesting coil electrically connected to the electronics module and configured to harvest power from the power transmission conductor and produce a voltage for powering the apparatus.

9. The apparatus according to claim 8, wherein the power harvesting coil harvests power inductively from the magnetic field of the power transmission conductor.

10. An apparatus configured to measure geomagnetically induced currents (GIC) temporarily flowing in high-voltage, 50 Hz or 60 Hz power transmission conductors, comprising:
   (a) a flux concentrator having a toroidal ferrite core and winding wound around the core configured to capture a magnetic field from the power transmission conductor, the flux concentrator being formed of first and second halves, wherein the winding is configured to reduce alternating current flux while leaving direct current flux unaffected;
   (b) a hall-effect sensor assembly configured to receive the magnetic field from the flux concentrator and produce a voltage signal corresponding to the magnetic field; and
   (c) an electronics module configured to receive the voltage signal from the hall-effect sensor assembly, conduct measurements, and transmit the measurements to a local access point, wherein the electronics module includes a direct current measurement circuit and an alternating current measurement circuit, wherein both of the current measurement circuits are electrically connected to the hall effect sensor.

11. The apparatus according to claim 10, wherein the first and second flux concentrator halves form a gap therebetween when the apparatus is secured to the power transmission conductor.

12. The apparatus according to claim 11, wherein the hall-effect sensor assembly is positioned in the gap between the first and second halves of the flux concentrator to obtain consistent readings of the magnetic field.

13. The apparatus according to claim 10, further including a jaw assembly configured to secure the apparatus to the power transmission conductor, the jaw assembly having first and second jaws pivotally connected to each other to allow the jaw assembly to move between an open position where the power transmission conductor is received therein and a closed position where the apparatus is secured to the power transmission conductor.

14. The apparatus according to claim 13, wherein the first half of the flux concentrator is secured to the first jaw and the second half of the flux concentrator is secured to the second jaw, such that when the jaw assembly is in the closed position, a gap is formed between the first and second halves of the flux concentrator.

15. A method for measuring geomagnetically induced currents (GIC) flowing in high-voltage, 50 Hz or 60 Hz power transmission conductors, comprising the steps of:

(a) securing an apparatus configured to measure GIC to a high-voltage conductor supplying a transformer, the apparatus having:
   (i) a flux concentrator;
   (ii) a hall-effect sensor assembly; and
   (iii) an electronics module;
(b) using the flux concentrator to capture a magnetic field from the power transmission conductor;
(c) using the hall-effect sensor assembly to receive the magnetic field from the flux concentrator and provide the electronics module with a voltage signal corresponding to the magnetic field;
(d) splitting the voltage signal from the hall effect sensor assembly to provide measurement of both alternating and direct currents, wherein a first one of the voltage signals is processed by a direct current measurement circuit of the electronics module and a second one of the voltage signals is processed by an alternating current measurement circuit of the electronics module; and
(e) using the electronics module to process the voltage signal from the hall effect sensor and transmit data to a local access point.

16. The method according to claim 15, wherein the direct current measurement provides an indication of GIC level.

* * * * *